(12) United States Patent
Cote et al.

(10) Patent No.: US 7,884,726 B2
(45) Date of Patent: Feb. 8, 2011

(54) TRANSFER TAPE STRAP PROCESS

(75) Inventors: Andre Cote, Williamstown, NJ (US); Detlef Duschek, Sensbachtal (DE)

(73) Assignee: Checkpoint Systems, Inc., Thorofare, NJ (US)

( * ) Notice: Subject to any disclaimer, the term of this patent is extended or adjusted under 35 U.S.C. 154(b) by 0 days.

(21) Appl. No.: 12/626,170

(22) Filed: Nov. 25, 2009

(65) Prior Publication Data

US 2010/0083493 A1 Apr. 8, 2010

Related U.S. Application Data

(62) Division of application No. 11/400,932, filed on Apr. 10, 2006, now Pat. No. 7,646,304.

(51) Int. Cl.
*G08B 13/14* (2006.01)

(52) U.S. Cl. .................. 340/572.7; 340/572.8; 257/679; 257/700

(58) Field of Classification Search ............... 340/572.7, 340/572.8
See application file for complete search history.

(56) References Cited

U.S. PATENT DOCUMENTS

| | | | |
|---|---|---|---|
| 3,724,737 A | 4/1973 | Bodnar |
| 3,863,857 A | 2/1975 | Smith |
| 3,891,157 A | 6/1975 | Justus |
| 3,989,575 A | 11/1976 | Davies et al. |
| 4,111,378 A | 9/1978 | Barwick |
| 4,135,677 A | 1/1979 | Warczak |
| 4,242,663 A | 12/1980 | Slobodin |
| 4,480,742 A | 11/1984 | Muylle |
| 4,567,473 A | 1/1986 | Lichtblau |
| 4,620,184 A | 10/1986 | Nedstedt |
| 4,658,264 A | 4/1987 | Baker |
| 4,690,720 A | 9/1987 | Mack |

(Continued)

FOREIGN PATENT DOCUMENTS

DE 19805031 6/2002

(Continued)

OTHER PUBLICATIONS

Patent Abstracts of Japan, Publication No. 03046242, Feb. 27, 1991, Fujistu Ltd.

(Continued)

*Primary Examiner*—Kenneth A Parker
*Assistant Examiner*—Jose R Diaz
(74) *Attorney, Agent, or Firm*—Caesar, Rivise, Bernstein, Cohen & Pokotilow, Ltd.

(57) ABSTRACT

A method for efficiently producing a plurality of EAS or RFID tags or inlays that form a label ready for use. The process utilizes a first web of RFID chip straps or capacitor straps that are releasably secured to a liner using only a low tack adhesive and utilizes a second web of coils or antennas which are secured to a second liner. After indexing these two webs, selective heat and pressure are applied to the chips straps or to the capacitor straps to transfer them and electrically couple them to a corresponding coil or antenna. Where both chip straps and capacitor straps are applied to a common antenna, a third web of the additional strap is used in the process.

18 Claims, 6 Drawing Sheets

U.S. PATENT DOCUMENTS

| | | | |
|---|---|---|---|
| 4,818,312 | A | 4/1989 | Benge |
| 4,835,524 | A | 5/1989 | Lamond et al. |
| 4,910,499 | A | 3/1990 | Benge et al. |
| 5,021,110 | A | 6/1991 | Kobayashi |
| 5,108,822 | A | 4/1992 | Imaichi et al. |
| 5,153,983 | A | 10/1992 | Oyama |
| 5,172,461 | A | 12/1992 | Pichl |
| 5,264,061 | A | 11/1993 | Juskey et al. |
| 5,357,240 | A | 10/1994 | Sanford et al. |
| 5,519,381 | A | 5/1996 | Marsh et al. |
| 5,528,222 | A | 6/1996 | Moskowitz et al. |
| 5,660,663 | A | 8/1997 | Chamberlain et al. |
| 5,781,110 | A | 7/1998 | Habeger, Jr. et al. |
| 5,867,102 | A | 2/1999 | Souder et al. |
| 5,920,290 | A | 7/1999 | McDonough et al. |
| 6,019,865 | A | 2/2000 | Palmer et al. |
| 6,100,804 | A | 8/2000 | Brady et al. |
| 6,181,287 | B1 | 1/2001 | Beigel |
| 6,357,503 | B1 | 3/2002 | Kromer et al. |
| 6,459,588 | B1 * | 10/2002 | Morizumi et al. ........... 361/737 |
| 6,665,193 | B1 | 12/2003 | Chung et al. |
| 6,940,408 | B2 | 9/2005 | Ferguson et al. |
| 6,951,596 | B2 | 10/2005 | Green et al. |
| 6,988,666 | B2 | 1/2006 | Appalucci et al. |
| 7,109,867 | B2 | 9/2006 | Forster |
| 7,116,231 | B2 * | 10/2006 | Kayanakis et al. ....... 340/572.7 |
| 7,495,566 | B2 * | 2/2009 | Jorgensen ................ 340/572.7 |
| 2004/0194876 | A1 | 10/2004 | Overmeyer et al. |
| 2005/0128086 | A1 | 6/2005 | Brown et al. |
| 2005/0183264 | A1 | 8/2005 | Eckstein et al. |
| 2006/0010685 | A1 | 1/2006 | Kobayashi et al. |
| 2007/0090955 | A1 | 4/2007 | Cote et al. |

FOREIGN PATENT DOCUMENTS

| | | |
|---|---|---|
| DE | 19634473 | 6/2003 |
| DE | 19840226 | 2/2006 |
| EP | 0682333 | 11/1996 |
| WO | 93/25169 | 12/1993 |
| WO | 96/27177 | 9/1996 |
| WO | 97/14126 | 4/1997 |
| WO | 2006/035606 | 6/2006 |
| WO | 2007/097811 | 8/2007 |

OTHER PUBLICATIONS

Patent Abstracts of Japan, Publication No. 06275662, Sep. 30, 1994, Hitachi Ltd.
Patent Abstracts of Japan, Publication No. 54019363, Feb. 14, 1979.
Patent Abstracts of Japan, Publication No. 55107239, Aug. 16, 1980, Toshiba Corp.
Patent Abstracts of Japan, Publication No. 55151342, Nov. 25, 1980, Clarion Co. Ltd.
Patent Abstracts of Japan, Publication No. 58025242, Feb. 15, 1983.
Patent Abstracts of Japan, Publication No. 60063939, Apr. 12, 1985, Tomoegawa Paper Co. Ltd.
Patent Abstracts of Japan, Publication No. 60063940, Apr. 12, 1985, Sanklen Electric Co. Ltd.
Patent Abstracts of Japan, Publication No. 61116846, Jun. 4, 1986, Mitsubishi Electric Corp.

* cited by examiner

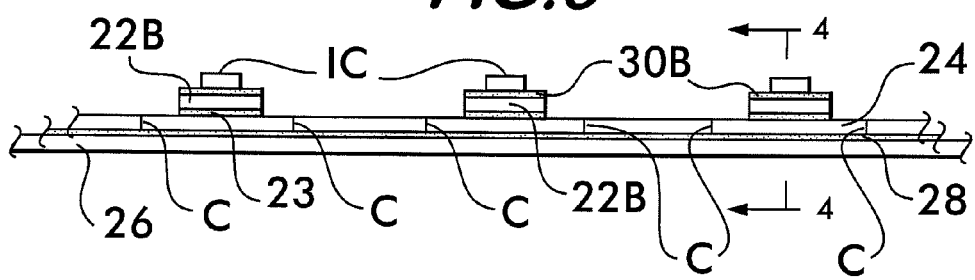
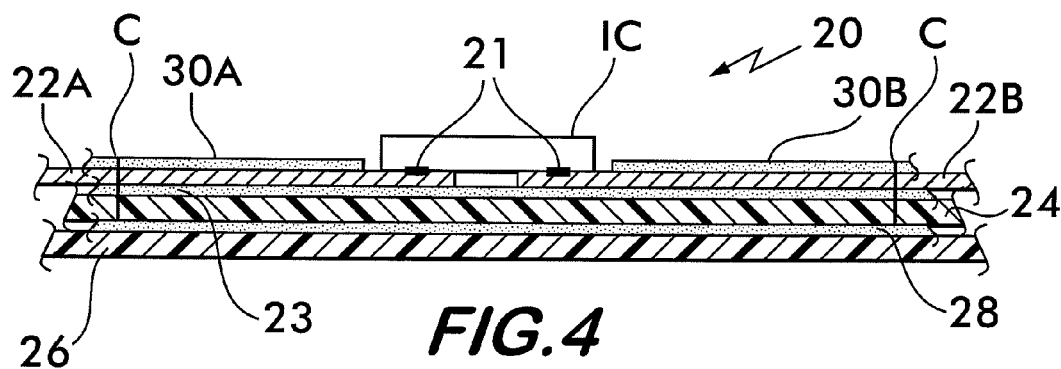
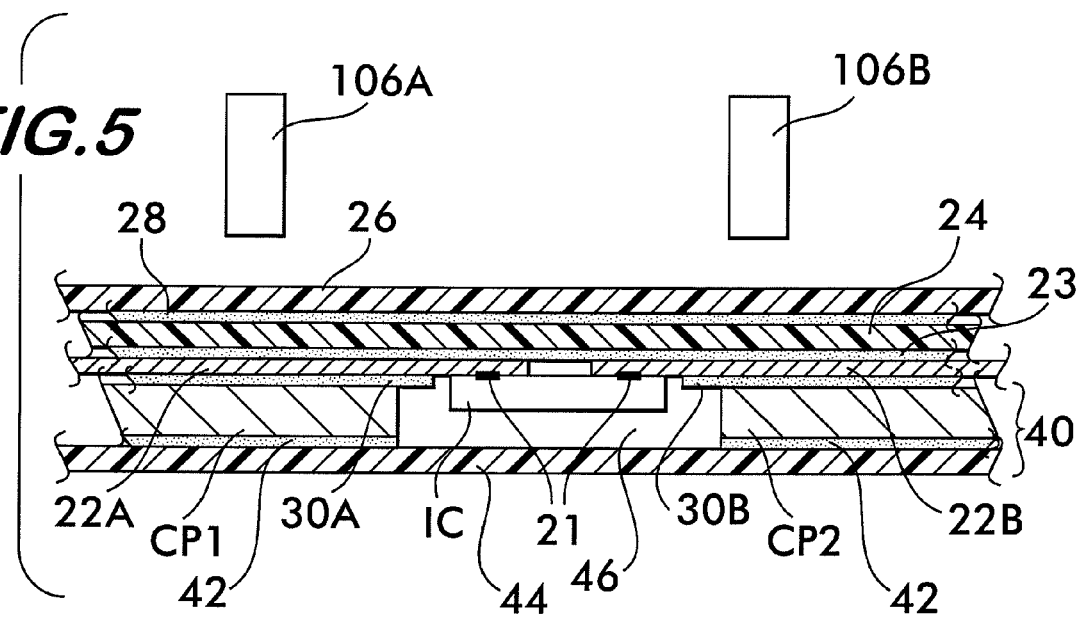

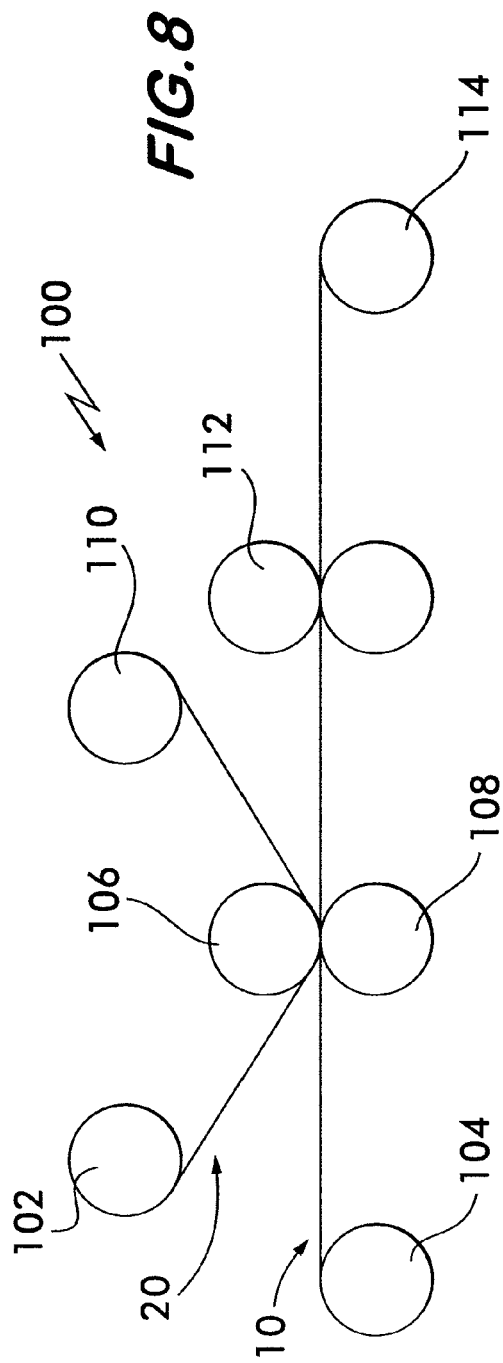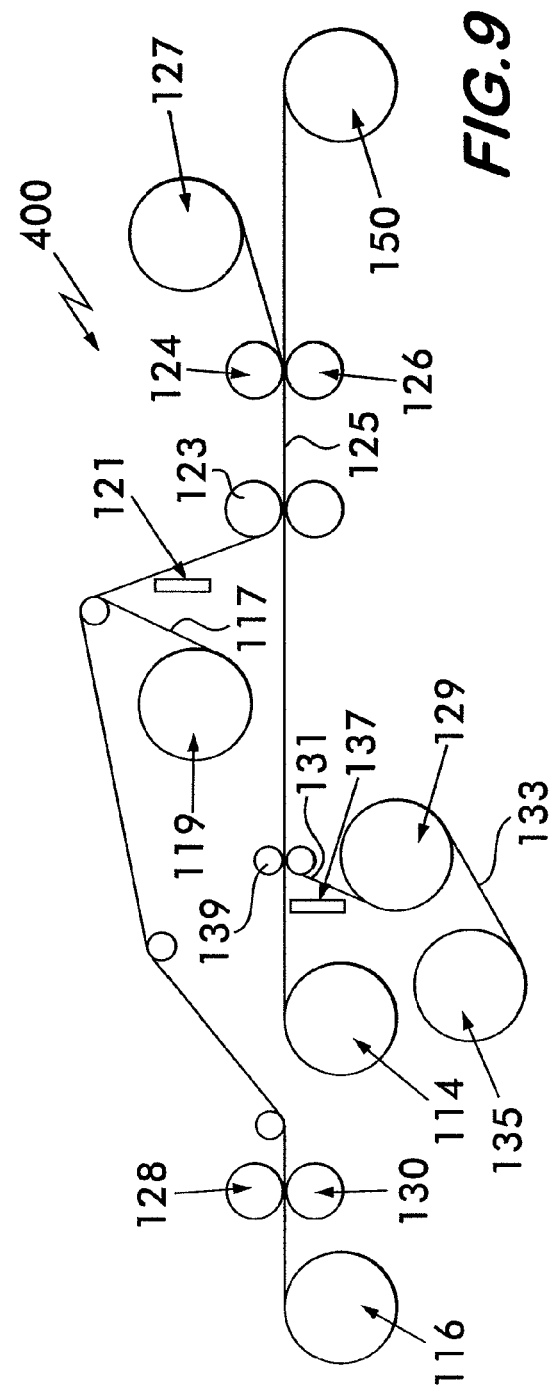

TRANSFER TAPE STRAP PROCESS

CROSS REFERENCE TO RELATED APPLICATIONS

This divisional application claims the benefit under 35 U.S.C. §121 of application Ser. No. 11/400,932 filed on Apr. 10, 2006, now U.S. Pat. No. 7,646,304, and whose entire disclosure is incorporated by reference herein.

BACKGROUND OF THE INVENTION

1. Field of Invention

The current invention relates to security tags and more particularly, discloses a method for applying a capacitor strap or chip strap to an antenna to form an EAS or RFID security tag.

2. Description of Related Art

Electronic article surveillance (EAS) security tags, typically comprise a resonant circuit that utilize at least one coil and at least one capacitor that operate to resonate when exposed to a predetermined electromagnetic field (e.g., 8.2 MHz) to which the EAS tag is exposed. By way of example only, the coil and the capacitor are etched on a substrate whereby a multi-turn conductive trace (thereby forming the coil) terminates in a conductive trace pad which forms one plate of the capacitor. On the opposite side of the substrate another conductive trace pad is etched to form the second capacitor plate, while an electrical connection is made through the substrate from this second plate to the other end of the coil on the first side of the substrate; the non-conductive substrate then acts as a dielectric between the two conductive trace pads to form the capacitor. Thus, a resonant circuit is formed. Various different resonant tag products are commercially available and described in issued patents, for example, U.S. Pat. Nos. 5,172,461; 5,108,822; 4,835,524; 4,658,264; and 4,567,473 all describe and disclose electrical surveillance tag structures. However, such products utilize, and indeed require, substrates which use patterned sides of conductive material on both face surfaces of the substrate for proper operation. Special conductive structures and manufacturing techniques must be utilized on both substrate faces for producing such resonant tag products. Currently available EAS tag structures have numerous drawbacks. For example, since special patterning and etching techniques must be utilized on both sides of the available tags to produce the proper circuit, per unit processing time and costs are increased. Furthermore, the complexity of the manufacturing machinery required for production is also increased. Oftentimes, complex photo-etching processes are used to form the circuit structures. As may be appreciated, two sided photo-etching is generally time consuming and requires precise alignment of the patterns on both sides. Additional material is also necessary to pattern both sides, thus increasing the per unit material costs. U.S. Pat. No. 5,781,110 (Habeger, et al.) discloses the application of a dielectric ink substance on top of a spiral inductive element to form a capacitive element.

With particular regard to radio frequency identification (RFID) tags, RFID tags include an integrated circuit (IC) coupled to a resonant circuit as mentioned previously or coupled to an antenna (e.g., a dipole) which emits an information signal in response to a predetermined electromagnetic field (e.g., 13.56 MHz). Recently, the attachment of the IC has been accomplished by electrically-coupling conductive flanges to respective IC contacts to form a "chip strap." This chip strap is then electrically coupled to the resonant circuit or antenna. See for example U.S. Pat. Nos. 6,940,408 (Ferguson, et al.); 6,665,193 (Chung, et al.); 6,181,287 (Beigel); and 6,100,804 (Brady, et al.).

Furthermore, it has been determined that the formation of the capacitive element of the EAS circuit or of the RFID circuit is what substantively controls the tuning of the EAS resonant circuit, or the RFID circuit, to respond properly to the desired electromagnetic field. The assignee of the present application, namely, Checkpoint Systems, Inc. has filed on Oct. 25, 2005, U.S. Application Ser. No. 60/730,053 entitled "Capacitor Strap" which discloses a flexible capacitor strap that can be applied to an antenna circuit to form an EAS security tag.

However, there remains a need to apply a plurality of either chip straps or capacitor straps in large quantities and to do so efficiently. The method of the present invention provides a solution to this problem.

All references cited herein are incorporated herein by reference in their entireties.

BRIEF SUMMARY OF THE INVENTION

A web comprising a plurality of strap components that are releasably secured to a liner portion of the web but are separated from adjacent strap components and wherein each of the strap components comprises a thin, generally planar member comprising a first electrically conductive planar element, a second planar electrically conductive element and an integrated circuit being electrically connected to respective ends of the conductive elements, wherein the first electrically conductive planar element and the second planar electrically conductive element are secured to a first side of a non-conductive layer and wherein a second side of the non-conductive layer is releasably secured (e.g., a low tack removable adhesive) to the liner portion.

A web comprising a plurality of strap components that are releasably secured to a liner portion of the web but are separated from adjacent strap components and wherein each of the strap components comprises a thin, generally planar member comprising a first electrically conductive planar element, a second planar electrically conductive element and a planar dielectric layer disposed between at least portions of the first and second electrically conductive planar elements, whereupon the strap component exhibits a desired capacitance, wherein the first electrically conductive planar element and the second planar electrically conductive element are secured to a first side of a non-conductive layer and wherein a second side of the non-conductive layer is releasably secured (e.g., a low tack removable adhesive) to the liner portion.

A method for forming a plurality of EAS or RFID tags or inlays wherein the method comprises: providing a first web comprising a plurality of RFID chip straps or capacitor straps on a first liner, each of the chip straps or capacitor straps being releasably secured (e.g., a low tack adhesive) to the first liner and wherein each of the chip straps, or the capacitor straps, is separated from adjacent straps; providing a second web of a plurality of antennas or coils on a second liner; indexing the first and second webs so that one of the chip straps or one of the capacitor straps is aligned with a corresponding one of the plurality of antennas or one of the plurality of coils; and applying selective heat and pressure to each of the chip straps or the of the capacitor straps to release the chip strap or the capacitor strap from the first liner while electrically connecting the chip strap or the capacitor strap to the corresponding one of the plurality of antennas or of the plurality of coils to form an EAS or RFID tag or inlay.

A method for forming a plurality of RFID tags or inlays wherein the method comprises: providing a first web comprising a plurality of RFID chip straps on a first liner, each of the chip straps being releasably secured (e.g., a low tack adhesive) to the first liner and wherein each of the chip straps is separated from adjacent chip straps; providing a second web comprising a plurality of capacitor straps on a second liner, each of the capacitor straps being releasably secured to the second liner and wherein each of the capacitor straps is separated from adjacent capacitor straps; providing a third web of a plurality of antennas or coils on a third liner; indexing the first and third webs so that one of the chip straps is aligned with a corresponding one of the plurality of antennas or one of the plurality of coils; applying selective heat and pressure to each of the chip straps to release the chip strap from the first liner while electrically connecting the chip strap to the corresponding one of the plurality of antennas or of the plurality of coils; indexing the second and third webs so that one of the capacitor straps is aligned with the corresponding one of the plurality of antennas or one of the plurality of coils; and applying selective heat and pressure to each of the capacitor straps to release the capacitor strap from the second liner while electrically coupling the capacitor strap to the corresponding one of the plurality of antennas or of the plurality of coils to form an RFID tag or inlay.

BRIEF DESCRIPTION OF SEVERAL VIEWS OF THE DRAWINGS

The invention will be described in conjunction with the following drawings in which like reference numerals designate like elements and wherein:

FIG. 3 is a partial top plan view of the web holding a plurality of chip straps of the present invention;

FIG. 4 is an enlarged side view of the web holding a plurality of chip straps of the present invention;

FIG. 5 shows an inverted chip strap of the present invention as it is being applied to a coil or antenna;

FIG. 8 provides process diagram for the tape transfer strap process of the present invention; and FIG. 9 provides an exemplary label process diagram showing how the EAS or RFID tag or inlay can then be formed into a label that is ready for use by a customer.

DETAILED DESCRIPTION OF THE INVENTION

Figure 1A:
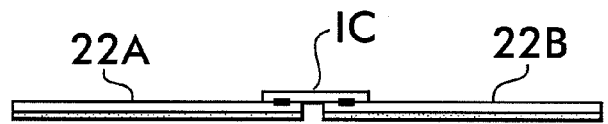
FIG. 1A is an enlarged cross-sectional view of a chip strap.
Figure 1B:
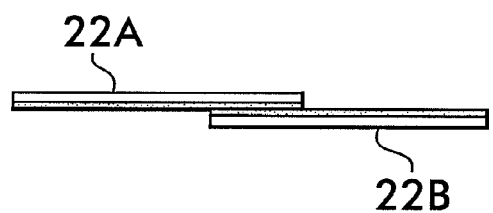
FIG. 1B is an enlarged cross-sectional view of a capacitor strap.
Figure 1C:
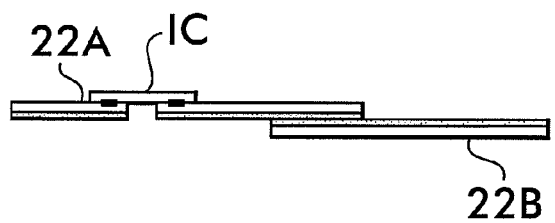
FIG. 1C is an enlarged cross-sectional view of a combined chip strap and capacitor strap.

As mentioned earlier, the method disclosed in the present invention is directed to the application of capacitor straps or chip straps to an antenna or coil. Although the majority of the figures depict the attachment of chip straps to an antenna, it should be understood that they can just as easily depict the attachment of capacitor straps thereto. FIG. 1A depicts an exemplary chip strap 2, FIG. 1B depicts an exemplary capacitor strap 4 and FIG. 1C depicts an exemplary combined chip strap and capacitor strap 6, the details of which are disclosed in U.S. Application Ser. No. 60/730,053 and whose entire disclosure is incorporated by reference herein. Thus, the method is not limited to only attaching chip straps. The term "strap" as used throughout this Specification includes any of these flexible-type chip straps, capacitor straps, combined chip strap/capacitor straps.

Figure 2:
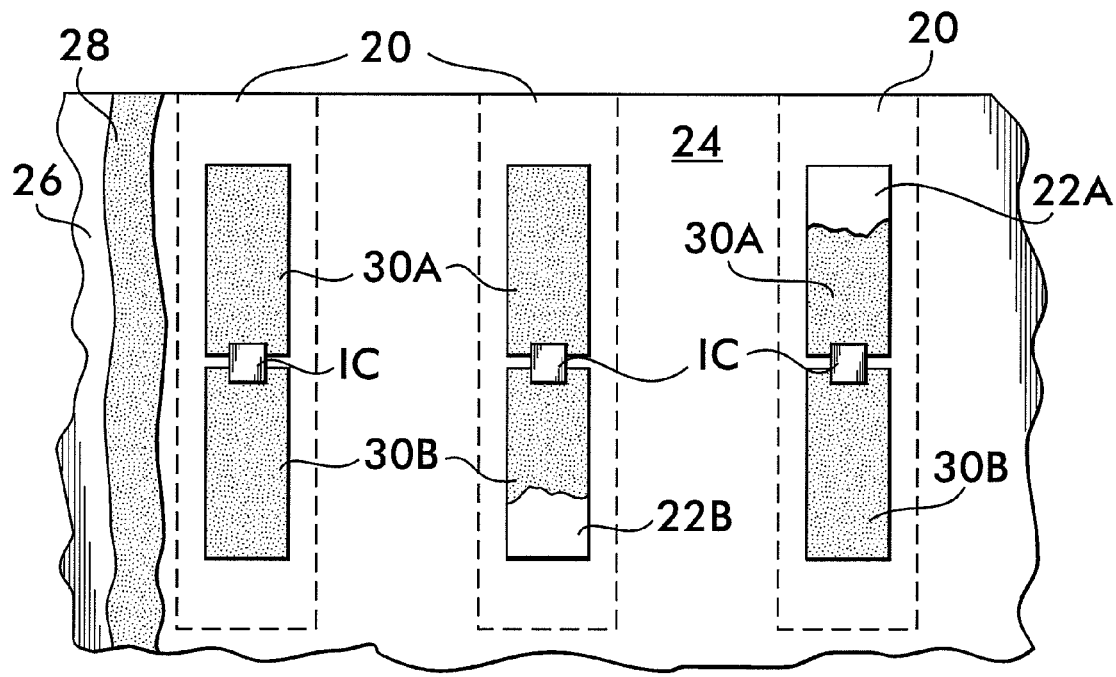
FIG. 2 is an enlarged cross-sectional view of the chip strap of the present invention.

To facilitate the quick and efficient attachment of a plurality of straps to a plurality of antennas or coils (the reference number 10 meaning either an antenna or a coil) to form an EAS or RFID security tag or inlay, the configuration of straps depicted in FIGS. 1A-1C is shown in FIG. 2 using a chip strap by way of example only. The strap of the present invention 20 comprises an RFID integrated circuit (IC), such as those manufactured by Philips Semiconductor, Texas Instruments, Impinj, STMicroelectronics, etc., but could just as easily be a capacitor strap or combined chip strap/capacitor strap mentioned earlier. In particular, the IC is electrically coupled 21 (e.g., wire bonded) to respective conductive (e.g., aluminum) elements 22A and 22B having a thickness, by way of example only, in the range of approximately 5 to 60 microns. These conductive elements 22A and 22B are secured (e.g., via an adhesive 23, such as heat seal, water base co-polymer, polyurethane, etc.) to a non-conductive layer or substrate 24 (e.g., a polymer). A liner 26 is attached to the opposite side of the substrate 24 using a removable adhesive 28; this removable adhesive is low tack and similar to what is used on stationary notes that are sold under the mark POST-IT® and examples of such adhesives are Rafsec RR27 removable acrylic, or Fasson URI, R10, R195, etc.). Another adhesive 30A/30B (e.g., a conductive adhesive, paste, tape, etc., such as anisotropic conductive paste from Delo Adhesives #163, National Strach, Dupont, Locktite, Acheson, etc.) is applied to the upper surface 32A of the conductive elements 22A and 22B.

It should be noted that another variation in the application of the adhesive 30A/30B where the strap 20 is a chip strap, is to apply the adhesive 30A and 30B to the corresponding conductive elements 22A and 22B during chip strap formation, i.e., before the IC is electrically connected to the conductive elements 22A and 22B. With the adhesives 30A and 30B covering the entire upper surface 32A of the conductive elements 22A/22B, when the IC is pressed down and electrically connected to the respective conductive elements, the adhesives 30A and 30B are compressed and forced out from under the IC and covering over the ends of the IC, thereby providing additional securement of the chip to the conductive elements 22A and 22B.

As will be discussed in detail later, a plurality of these straps 20 are provided on a single web that forms the liner 26. As shown most clearly in FIGS. 3-4, each strap 20 is severed from its neighboring strap (see cut C), with each of the straps 20 being releasably secured to the liner 26 via the removable adhesive layer 28. To apply an individual strap 20 to an antenna or coil, the strap 20 is inverted as shown in FIG. 5 and the respective conductive elements 22A and 22B are positioned over the corresponding connecting points on the antenna or coil (FIG. 5) so that the adhesive 30 comes into contact with the connecting points CP1/CP2 of the antenna or coil. In particular, as will be discussed in detail later, in the process, each strap 20 is indexed to be positioned closely adjacent a corresponding antenna or coil. By way of example only, the connecting points CP1/CP2 of a coil provided on a coil web 40 (a portion of which is shown in FIG. 5) is shown in FIG. 5. The coil web 40 comprises a plurality of coils that are also removably secured, by a removable adhesive 42 (e.g., similar to adhesive 23 discussed previously including heat seal, water base copolymer, polyurethane, etc.), to a liner 44. Thus, as will also be discussed later, once the strap 20 is electrically connected to the coil (or antenna), each completed EAS (or RFID) tag or inlay can then be removed from the liner 44 and applied to an item using the adhesive 42. It should be understood that the web 40 can also represent an antenna web where instead of a plurality of coils being releasably secured thereon, a plurality of antennas can be provided that are releasably secured thereon.

To electrically connect the strap 20 to the coil (or antenna), heat and pressure are then selectively applied (using heating elements 106A and 106B) against the liner 26 at locations aligned with the corresponding adhesives 30A and 30B. This causes the adhesives 30A/30B to bond the conductive elements 22A and 22B to the antenna connecting points. This selective application of heat simultaneously causes the removable adhesive 28 to lose its tack, thereby allowing the liner 26 to be removed along with the adhesive 28. Pressure and crimping (33 and 35) at these locations forms a good electrical connection; e.g., the shards and sharp edges of the crimping action create a good electrical connection. The end result is a strap 20 electrically connected to the antenna or coil. It should be understood that it is within the broadest scope of the present invention to include the use of chemicals to form the connection between the strap 20 and the antenna or coil; in that situation, pressure is applied but there is no need to crimp.

It should be further noted that the adhesives 30A/30B could initially be placed on the coil or antenna, rather than on the strap 20 itself.

It should be noted that the adhesive 23 (e.g., a water-based laminating adhesive) used in the formation of the chip strap/capacitor strap comprises a "patterned adhesive". In accordance with U.S. Pat. No. 6,988,666 (Appalucci, et al.), entitled "Security Tag and Process for Making Same" and U.S. Pat. No. 7,119,685 entitled "A Method for Aligning Capacitor Plates in a Security Tag and a Capacitor Formed Thereby", and all of whose entire disclosures are incorporated by reference herein, the conductive elements 22A/22B are formed by applying a layer of conductive material (e.g., aluminum) to the non-conductive substrate 24 (e.g., a polymer) using the patterned adhesive 23 to form a laminate. The adhesive 23 is in the form of the conductive elements 22A/22B. Thus, when, a cutter (in the desired shape of the conductive elements 22A/22B) is applied against the conductive layer, the only portion of the conductive layer that remains adhesively secured to the substrate 24 is the conductive elements 22A/22B; the remaining portion of the conductive layer can be removed and recycled. Moreover, this same process (e.g., of using a patterned adhesive) may be used for the formation of the coil 202 or antenna 302A/302B (see coil or antenna web 40 in FIG. 5) to which the chip strap/capacitor strap 20 is attached.

Figure 6A:
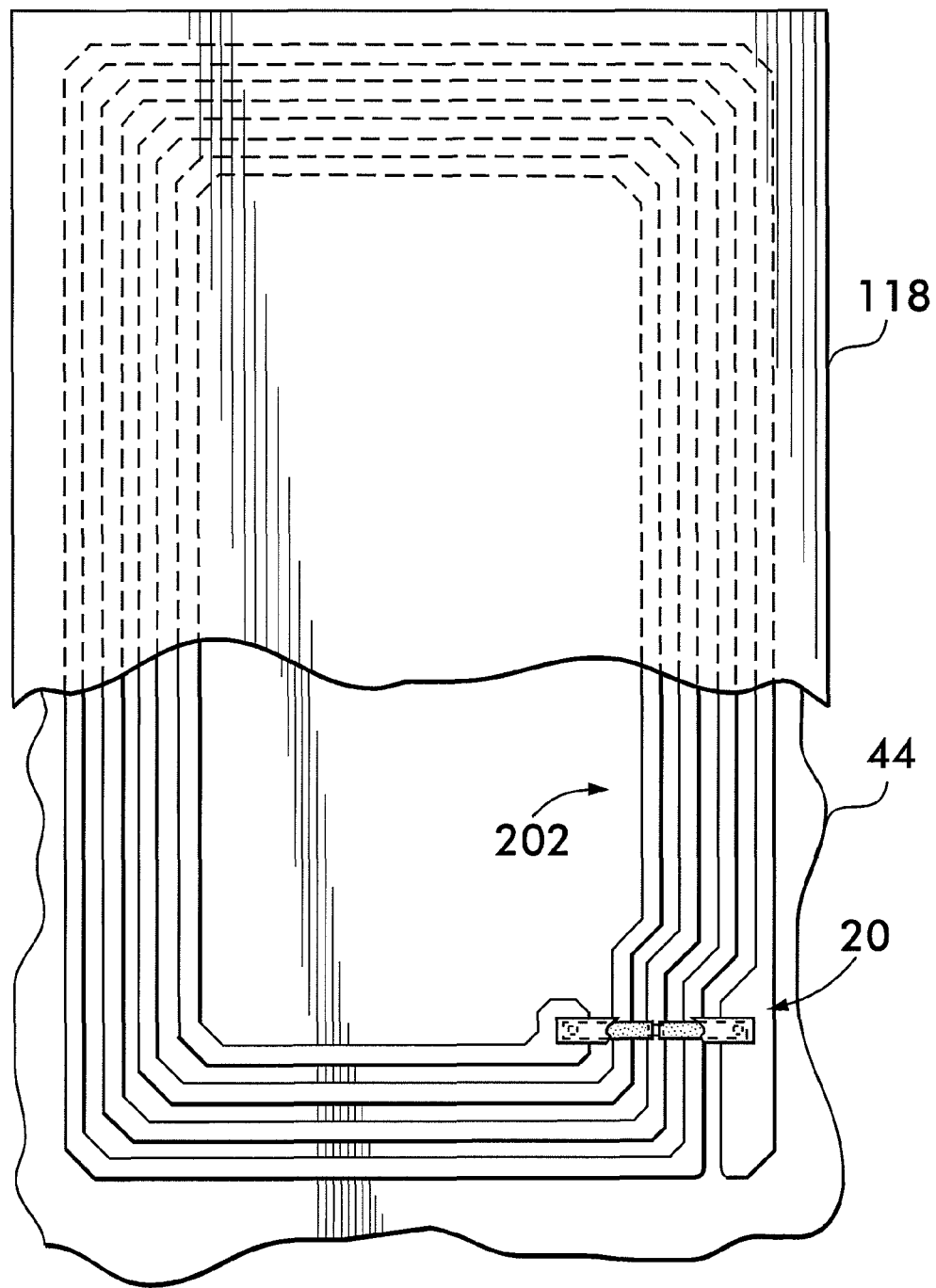
FIG. 6A depicts an exemplary HF (high frequency) security tag created using a chip strap in the process of the present invention.
Figure 6D:
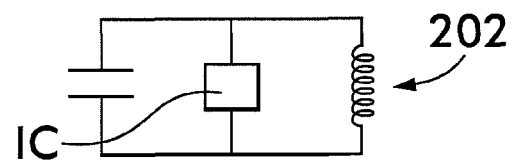
FIG. 6D is an equivalent circuit of FIGS. 6A-6C.
Figure 6B:
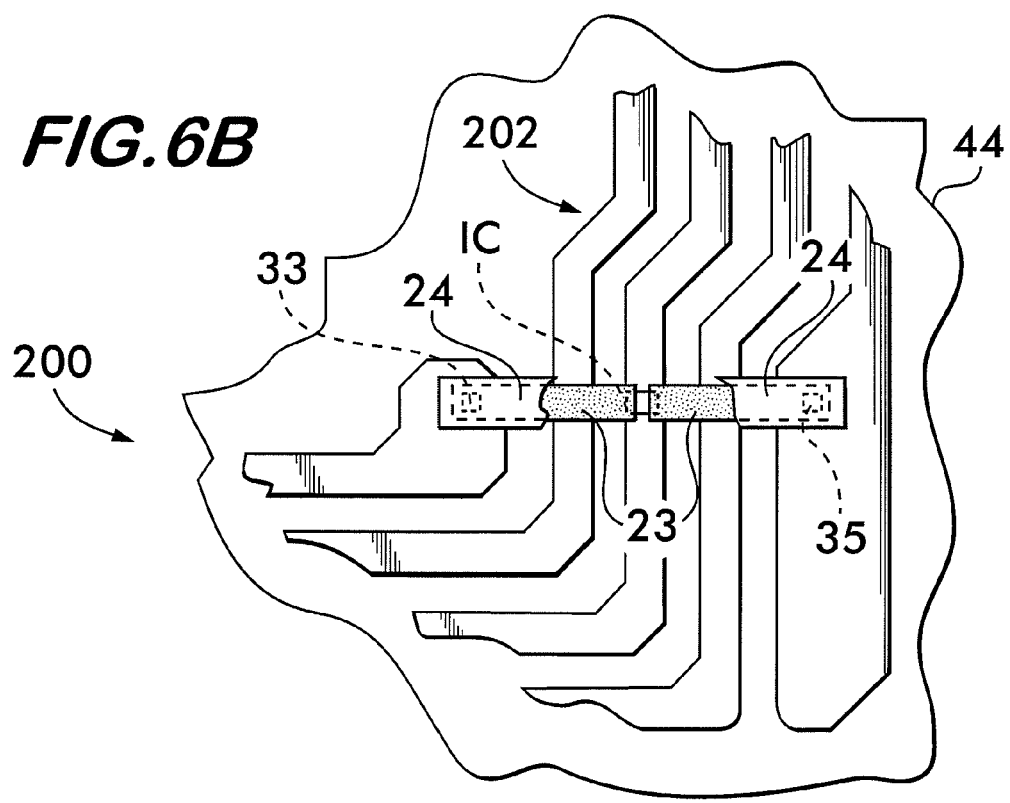
FIG. 6B depicts an enlargement of the chip strap coupled to the coil of the HF security tag of FIG. 6A.
Figure 6C:
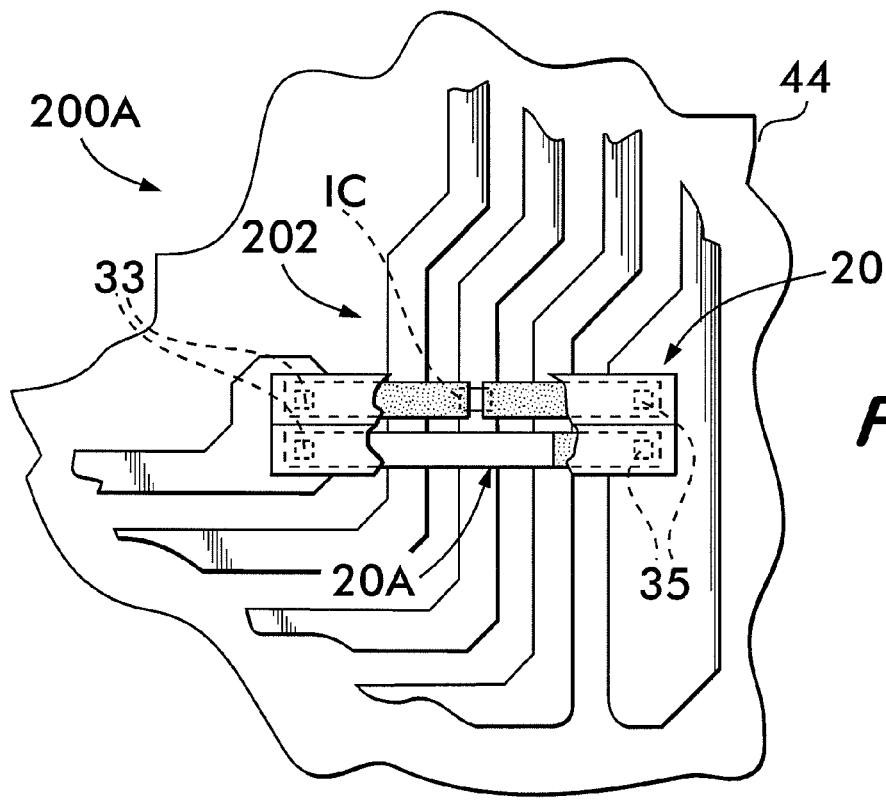
FIG. 6C depicts another exemplary HF security tag created using a chip strap and a capacitor strap in the process of the present invention
Figure 7A:
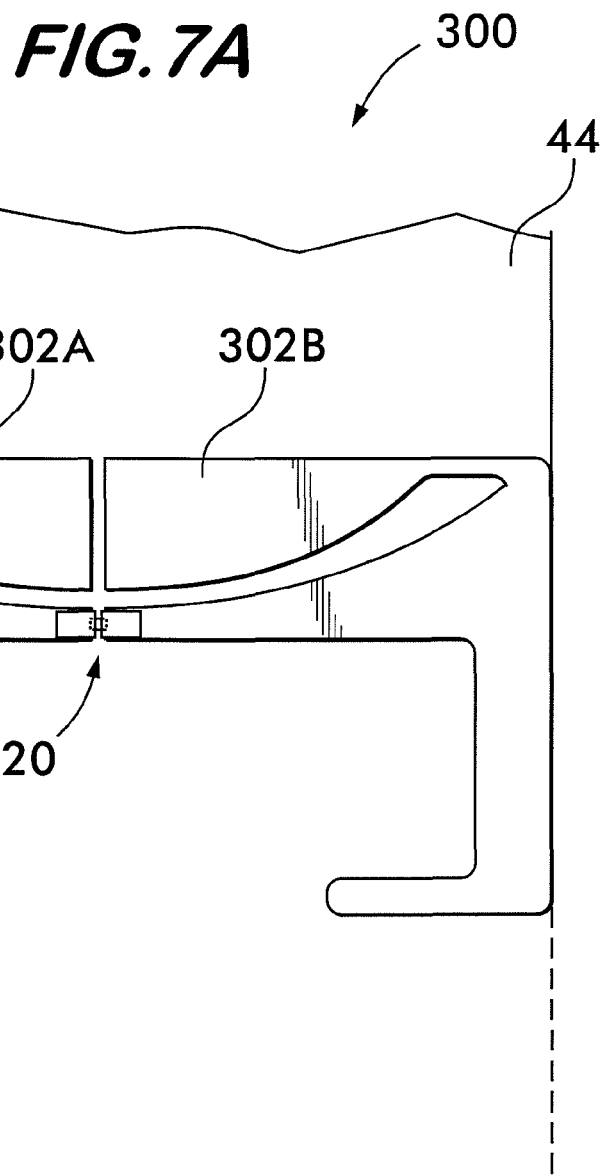
FIG. 7A depicts an exemplary UHF (ultra high frequency) security tag created using a chip strap in the process of the present invention.
Figure 7B:
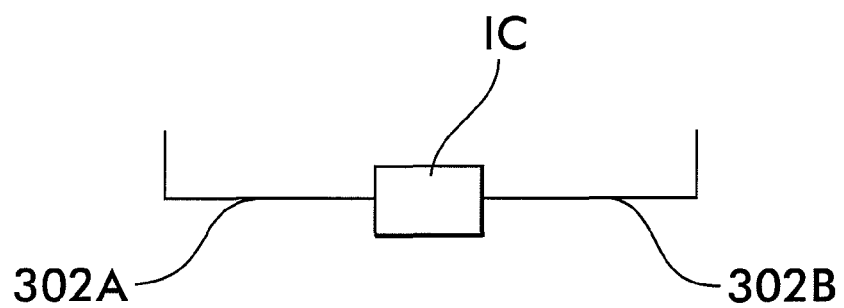
FIG. 7B depicts an equivalent circuit of the present invention.

By way of example only, FIGS. 6A-6D depict an HF security tag 200 using the process of the present invention and FIGS. 7A-7B depict a UHF security tag 300 using the process of the present invention. In particular, FIG. 6A illustrates a multi-turn coil 202 to which a chip strap 20 of the present invention is secured. It should be noted that in coupling the chip strap 20 to the coil 202, the adhesive layer 30A/30B also acts as an insulator to prevent shorting the conductive members 22A/22B to any of the coil paths other than the two to which the chip strap 20 is electrically coupled. FIG. 6B is an enlargement of the chip strap 20 coupled to the coil 202. FIG. 6C illustrates another HF security tag 200A using the process of the present invention but where a capacitor strap 20A, in addition to the chip strap 20, is also electrically coupled to the coil 202; by way of example only, the HF security tag 200A requires additional capacitance (hence, the capacitor strap 20A) in addition to the internal capacitance provided by the IC. FIG. 6D is an equivalent circuit of the security of FIGS. 6A-6C. FIG. 7A depicts a UHF security tag 300 whereby a chip strap 20 is coupled between the antenna elements 302A and 302B. FIG. 7B is an equivalent circuit of the UHF security tag 300. As mentioned previously, the multi-turn coil 202 and the antenna elements 302A/302B may be formed using the process disclosed in U.S. Pat. No. 6,988,666 (Appalucci, et al.), entitled "Security Tag and Process for Making Same" and U.S. Pat. No. 7,119,685 entitled "A Method for Aligning Capacitor Plates in a Security Tag and a Capacitor Formed Thereby".

Furthermore, for antennas that operate in the UHF range, a process for forming these types of antennas on antenna web (similar to the web 40 shown in FIG. 5) is disclosed in U.S. Pat. No. 7,497,004 entitled "Process for Making UHF Antennas for EAS and RFID Tags and Antennas Made Thereby" filed contemporaneously herewith and whose entire disclosure is incorporated by reference herein. This latter process uses a method of producing a very thin, flexible UHF antenna which involves providing a conductor sheet comprising a layer of electrically conductive material (e.g., aluminum) having a top surface and an undersurface, and wherein the conductor sheet has a thickness in the range of approximately 5 to 60 microns; a liner sheet (similar to liner 44 in FIG. 5) is provided having a top surface; disposing the conductor sheet on the liner sheet so that the undersurface of the conductor sheet is releasably secured to the top surface of the liner sheet by a releasably securable adhesive (similar to adhesive 42 of FIG. 5) substantially coextensive with the conductor sheet; the conductor sheet is then formed into a shape desired for the antenna by bringing a cutting die having the desired shape into engagement with the conductor sheet, whereupon the die pierces through the conductor sheet, but not through the liner sheet, thereby creating a die cut antenna having the desired shape secured to the liner sheet. The waste material is removed between adjacent antennas formed in this process (thereby leaving a space 46, as shown in FIG. 5) and an antenna web (see web 40 in FIG. 5, as well as reference number 104 in FIG. 8). Alternatively, where even smaller thicknesses (e.g., less than 25 microns) of the conductor sheet of electrically conductive material are used, the conductor sheet is first fixedly secured to a reinforcing sheet (e.g., paper such as bond, offset, densified kraft, or any having the ability to support the conductor, or together form a supported composite material and having a thickness of approximately 50 microns as a composite, or 6 to 15 microns by itself) and the undersurface of that reinforcing sheet is then releasably secured to the top surface of the liner sheet; when the cutting die is applied, the die cuts through both the conductor sheet and the reinforcing sheet.

In order to create a plurality of security tags using these straps 20, FIG. 8 depicts the process 100. In particular, a strap roll 102 and an antenna/coil roll 104 (comprising the coil or antenna web 40) are indexed accordingly and fed between the heating elements 106 and roller (or anvil) 108. As can be seen in FIG. 8, the antenna/coil roll 104 is oriented so that the antennas 302 or coils 202 are facing upward and the straps 20 are facing downward (although these relative positions are by way of example only; the antennas could be facing downward and the straps could be facing upward, etc.). Depending on the security tag being formed, the indexing is necessary to ensure that a strap 20 is properly positioned at the coil or antenna contact points CP1/CP2 when coupled thereto. In particular, the distance between adjacent coils 202/antenna 302 on the roll 104 is typically different than the spacing between adjacent straps 20 on the strap roll 102. Thus, dispensing of straps 20 from the strap roll 102 is paused as the proper alignment of the corresponding coil 202 or antenna 302 is made before the heating elements 106/roller 108 are operated. Once the heating elements 106/roller 108 are activated, the liner 26 is taken up by a take-up reel 110. With the strap 20 properly applied to the coil 202 or antenna elements 302, mechanical welding (e.g., crimping) is applied at station 112, as explained previously with regard to FIG. 5, thereby forming a particular security tag or inlay. The term "inlay" as used throughout this Specification means that the completed tag (e.g., EAS or RFID security tag) may themselves either form a portion of a label or be coupled to a label for use on, or otherwise associated with, an item. The tags/inlays are gathered on a security tag or inlay reel 114.

At this point, the tag/inlay reel 114 comprises a plurality of tags/inlays that are exposed. It should be understood that there are many different ways to "finish" off the tags/inlays to form a "label" that can be applied to an item and that it is within the broadest scope of the invention to include any of these. By way of example only, FIG. 9 depicts one of these exemplary label processes 400 in which the tag/inlays of reel 114 are made into labels. In particular, a reel of printable paper 116 is fed through a printing station 128 (including a roller or anvil 130) to provide the desired label printing onto the paper. If the paper on the reel 116 is adhesively secured to liner 117, then the liner is removed by a take-up reel 119; if, on the other hand, there is no liner 117, an adhesive 121 (e.g., such as a STD acrylic, or rubber-based hot melt adhesive) is applied to the paper. This paper is then applied on top of the plurality of tags/inlays from the reel 114 at station 123 to form a label matrix 125. Next, the label matrix 125 is then sent to a cutter 124 and roller (or anvil) 126. A take-up reel 127 removes the waste from the label matrix 125, resulting in the label product 150, ready for application on the various items.

Alternatively, as mentioned earlier where the coil/antenna web 40 is formed using a patterned adhesive, the antenna/coil web 40 requires application to a separate liner from which the tags/inlays can be removed. In particular, a reel 129 comprising a liner 131 has its cover sheet 133 removed by a take-up reel 135 to expose an adhesive thereon; alternatively, if the liner 131 has no cover sheet and adhesive, an adhesive can be applied to the liner at station 137. In either case, at station 139, the liner is then adhesively secured to the bottom of the coil/antenna web 40 from reel 114 to form a tag/inlay and liner product that is fed to the paper application stage 123. The process then continues as discussed previously.

It should be noted that the reel 116 is by way of example only and that the adhesive 120 could be applied directly to the completed tags/inlays 122 and then a printable paper 118 applied on top of the adhesive 120.

It should be noted that where a capacitor strap and a chip strap are being secured to a common coil or antenna (see FIG. 6C), the process shown in FIG. 8 is supplemented with a third web (not shown) which is then indexed also with the antenna web 104. It should be understood that either type of strap (chip strap or capacitor strap) could be applied before the other in the process. In addition a second take up reel (not shown) would also be present to take up the released liner from the web of capacitor straps.

While the invention has been described in detail and with reference to specific examples thereof, it will be apparent to one skilled in the art that various changes and modifications can be made therein without departing from the spirit and scope thereof.

What is claimed is:

1. A method for forming a plurality of security tags, said method comprising:

providing a first web comprising a plurality of capacitor straps on a first liner, each of said capacitor straps comprising a thin, generally planar member comprising a first electrically conductive planar element, a second planar electrically conductive element and a planar dielectric layer disposed between at least portions of said first and second electrically conductive planar elements, whereupon said capacitor strap exhibits a desired capacitance, each of said capacitor straps being secured to a first side of a non-conductive layer via an adhesive positioned on an exposed side of said first or second electrically conductive planar elements and on an exposed side of said planar dielectric layer and wherein a second side of said non-conductive layer is releasably secured to said first liner and wherein each of said capacitor straps is separated from adjacent straps;

providing a second web of a plurality of antennas or coils on a second liner;

indexing said first and second webs so that one of said capacitor straps is aligned with a corresponding one of said plurality of antennas or one of said plurality of coils; and applying selective heat and pressure to each of said capacitor straps to release said capacitor strap from said first liner while electrically connecting said capacitor strap to said corresponding one of said plurality of antennas or of said plurality of coils to form a security tag.

2. The method of claim 1 wherein each one of said capacitor straps is adhesively secured to said first liner using a low tack adhesive.

3. The method of claim 2 wherein said step of providing a first web comprises applying an adhesive on conductive elements on each of said capacitor straps.

4. The method of claim 3 wherein said step of indexing said first and second webs comprises orienting said webs so that said adhesive on said exposed sides contacts said corresponding one of said plurality of antennas or of said plurality of coils.

5. The method of claim 4 wherein said step of applying selective heat and pressure comprises directly applying heat and pressure against said first liner at a location corresponding to a portion of said conductive elements.

6. The method of claim 5 further comprising the step of taking up a portion of said first liner corresponding to said capacitor strap that is released therefrom.

7. The method of claim 5 wherein said step of directly applying heat and pressure against said first liner comprises crimping said conductive elements of said capacitor strap to said corresponding one of said plurality of antennas or of said plurality of coils.

8. The method of claim 5 wherein said step of directly applying heat and pressure against said first liner comprises using heating elements and a roller.

9. The method of claim 2 wherein said step of providing a second web of a plurality of antennas or coils on a second liner comprises applying a conductive adhesive on each of said plurality of antennas or coils to where each of said capacitor straps are to be connected.

10. A method for forming a plurality of RFID tags or inlays, said method comprising:
providing a first web comprising a plurality of RFID chip straps on a first liner, each of said RFID chip straps comprising a thin, generally planar member comprising a first electrically conductive planar element, a second electrically conductive planar element and an integrated circuit being electrically connected to respective ends of said conductive elements, and each of said chip straps being secured to a first side of a first non-conductive layer via an adhesive positioned on an exposed side of said first and second electrically conductive planar elements and wherein a second side of said first non-conductive layer is releasably secured to said first liner and wherein each of said chip straps is separated from adjacent chip straps;
providing a second web comprising a plurality of capacitor straps on a second liner, each of said capacitor straps comprising a thin, generally planar member comprising a first electrically conductive planar element, a second planar electrically conductive element and a planar dielectric layer disposed between at least portions of said first and second electrically conductive planar elements, whereupon said capacitor strap exhibits a desired capacitance, each of said capacitor straps being secured to a first side of a second non-conductive layer via an adhesive positioned on an exposed side of said first or second electrically conductive planar element and on an exposed side of said planar dielectric layer and wherein a second side of said second non-conductive layer is releasably secured to said second liner and wherein each of said capacitor straps is separated from adjacent capacitor straps;
providing a third web of a plurality of antennas or coils on a third liner;
indexing said first and third webs so that one of said chip straps is aligned with a corresponding one of said plurality of antennas or one of said plurality of coils;
applying selective heat and pressure to each of said chip straps to release said chip strap from said first liner while electrically coupling said chip strap to said corresponding one of said plurality of antennas or of said plurality of coils;
indexing said second and third webs so that one of said capacitor straps is aligned with said corresponding one of said plurality of antennas or one of said plurality of coils; and
applying selective heat and pressure to each of said capacitor straps to release said capacitor strap from said second liner while electrically connecting said capacitor strap to said corresponding one of said plurality of antennas or of said plurality of coils to form an RFID tag or inlay.

11. The method of claim 10 wherein each one of said chip straps and said capacitor straps are adhesively secured to said first and second liners, respectively, using a low tack removable adhesive.

12. The method of claim 11 wherein said steps of providing a first web and a second web comprises applying a conductive adhesive on conductive elements of each of said chip straps and on each of said capacitor straps.

13. The method of claim 12 wherein said step of indexing said first and second webs comprises orienting said webs so that said conductive adhesive on said conductive elements contacts said corresponding one of said plurality of antennas or of said plurality of coils.

14. The method of claim 13 wherein said step of applying selective heat and pressure comprises directly applying heat and pressure against said first liner at a location corresponding to a portion of said conductive elements of said chip strap and against said second liner at a location corresponding to a portion of said conductive elements of said capacitor strap.

15. The method of claim 14 further comprising the step of taking up a portion of said first liner corresponding to said chip strap and a portion of said second liner corresponding to said capacitor strap that are released from their respective liners.

16. The method of claim 14 wherein said step of directly applying heat and pressure against said first liner comprises crimping said conductive elements of said chip strap, and crimping said conductive elements of said capacitor strap, to said corresponding one of said plurality of antennas or of said plurality of coils.

17. The method of claim 14 wherein said step of directly applying heat and pressure against said first liner and against said second liner comprises using heating elements and a roller.

18. The method of claim 10 wherein said step of providing a third web of a plurality of antennas or coils on a third liner comprises applying a conductive adhesive on each of said plurality of antennas or coils to where each of said chip straps and each of said capacitor straps are to be connected.

* * * * *